(12) United States Patent
Naiki et al.

(10) Patent No.: US 8,124,173 B2
(45) Date of Patent: Feb. 28, 2012

(54) PROCESS FOR PACKAGING ELECTRONIC DEVICES

(75) Inventors: Masahiro Naiki, Yamaguchi (JP); Masayuki Kinouchi, Yamaguchi (JP); Seiji Ishikawa, Chiba (JP); Yuji Matsui, Yamaguchi (JP); Yoshiki Tanaka, Yamaguchi (JP)

(73) Assignee: UBE Industries, Ltd., Ube-shi, Yamaguchi (JP)

( * ) Notice: Subject to any disclaimer, the term of this patent is extended or adjusted under 35 U.S.C. 154(b) by 148 days.

(21) Appl. No.: 12/329,960

(22) Filed: Dec. 8, 2008

(65) Prior Publication Data

US 2009/0092748 A1    Apr. 9, 2009

Related U.S. Application Data

(63) Continuation of application No. 10/735,708, filed on Dec. 16, 2003, now abandoned.

(30) Foreign Application Priority Data

| | | |
|---|---|---|
| Dec. 16, 2002 | (JP) | 2002-363399 |
| Jan. 29, 2003 | (JP) | 2003-020936 |
| Jul. 15, 2003 | (JP) | 2003-197050 |
| Oct. 8, 2003 | (JP) | 2003-349227 |
| Oct. 23, 2003 | (JP) | 2003-363187 |

(51) Int. Cl.
*B05D 5/12* (2006.01)
*H01R 43/00* (2006.01)

(52) U.S. Cl. ........... 427/96.2; 427/96.4; 29/855; 29/885

(58) Field of Classification Search ................. 427/96.2, 427/96.4; 29/855, 885
See application file for complete search history.

(56) References Cited

U.S. PATENT DOCUMENTS

| | | | | |
|---|---|---|---|---|
| 3,271,625 A | * | 9/1966 | Caracciolo | 361/735 |
| 3,550,766 A | * | 12/1970 | Nixen et al. | 174/50.54 |
| 4,888,226 A | * | 12/1989 | Wong | 428/76 |

(Continued)

FOREIGN PATENT DOCUMENTS

| | | |
|---|---|---|
| JP | 2002-012664 | 1/2002 |
| JP | 2002012664 A * | 1/2002 |

(Continued)

OTHER PUBLICATIONS

English Language Translation (Machine Generated) 2002-012664 (Jan. 2002).

*Primary Examiner* — Brian K Talbot
(74) *Attorney, Agent, or Firm* — Nixon Peabody LLP; Jeffrey L. Costellia

(57) ABSTRACT

A process for packaging an electronic device employs an insulating protective resin layer produced from one or more of the resin compositions: (1) 100 parts of an organic solvent-soluble resin having a polysiloxane skeleton and a polar group, 0.5 to 30 parts of an epoxy compound having an epoxy equivalent of more than 800, and an organic solvent, (2) 100 parts of an organic solvent-soluble resin having a polysiloxane skeleton and a polar group, 0.1 to 10 parts of an epoxy compound having an epoxy equivalent of 100 to 800, 2 to 30 weight parts of a polyvalent isocyanate compound, and an organic solvent; and (3) 100 parts of an organic solvent-soluble resin having a polysiloxane skeleton and a polar group, 0.1 to 20 parts of an epoxy compound having an epoxy equivalent of more than 800, 2 to 30 parts of a polyvalent isocyanate compound, and an organic solvent.

6 Claims, 3 Drawing Sheets

U.S. PATENT DOCUMENTS

| | | | |
|---|---|---|---|
| 5,075,258 A * | 12/1991 | Carney et al. | 438/123 |
| 5,122,858 A * | 6/1992 | Mahulikar et al. | 257/753 |
| 5,817,544 A * | 10/1998 | Parthasarathi | 438/123 |
| 6,461,738 B2 | 10/2002 | Ishikawa et al. | |
| 6,632,523 B1 | 10/2003 | Rosenfeld et al. | |
| 6,849,945 B2 * | 2/2005 | Horiuchi et al. | 257/735 |
| 7,239,030 B2 | 7/2007 | Naiki et al. | |

* cited by examiner

US 8,124,173 B2

PROCESS FOR PACKAGING ELECTRONIC DEVICES

FIELD OF THE INVENTION

This invention relates to an improvement of a process for packaging an electronic device, and a curable resin composition favorably employable for the electronic device packaging process.

BACKGROUND OF THE INVENTION

Heretofore, there are known a number of systems for packaging an electronic device such as TCP (tape carrier package) and COF (chip on film). The COF is paid attention because the COF is favorably employable for packaging an electronic device with an increased density.

The conventional COF is illustrated in FIG. 1. The process for packaging an electronic device according to the conventional COF system is performed by the following steps:

preparing a printed wiring board 1 which has wiring copper layers 2 coated with an insulating protective resin layer 4, keeping an area for mounting an electronic device exposed;

plating the exposed area with tin to produce a tin layer 3;

mounting the electronic device 6 on the tin-plated area via an electroconductive material 5; and coating the mounted electronic device 6 and an edge of the insulating protective resin layer 4 with an encapsulant 7.

It is known that the insulating protective resin layer can be favorably produced by coating the wiring copper layers with a heat curable resin composition comprising an organic solvent-soluble resin having a polysiloxane skeleton (or polysiloxane chain) and a polar group, a heat curable compound and an organic solvent, and heating the coated resin composition. The heating is generally carried out at approx. 160° C.

U.S. Pat. No. 5,252,703 describes that a heat curable resin composition comprising 100 weight parts of a polyimide-siloxane, 1 to 50 weight parts of an epoxy resin, and an organic solvent can be employed for preparing an insulating protective layer on a flexible wiring board.

U.S. Pat. No. 6,461,738 describes a heat curable resin composition comprising 100 weight parts of a polyimide-siloxane, 2 to 40 weight parts of a polyvalent isocyanate, and an organic solvent can be employed for preparing an insulating protective layer on a flexible wiring board.

It has been recently noted that the conventional COF has a problem that disturbs packaging of an electronic device with a more increased density. The problem is that the plated tin enters between the wiring copper layer and the insulating protective layer and then reacts with copper in the wiring copper layer, resulting in production of a damaged portion in the wiring copper layer. The production of the damage portion in the wiring copper layer is particularly troublesome when the wiring copper layer is made thinner to further increase the packaging density.

In order to obviate the above-mentioned problem in the conventional COF packaging, an improved COF packaging system has been developed. The improved COF packaging system is described below, referring to FIG. 2.

The improved COF packaging system comprises the steps of:

preparing a printed wiring board 1 which has wiring copper layers 2 coated with a metal layer 3 comprising a metal (e.g., tin) other than copper;

plating the metal layer 3 with an insulating protective resin layer 4, keeping an area for mounting an electronic device exposed;

mounting the electronic device 6 on the exposed area via an electroconductive material 5; and coating the mounted electronic device 6 and a portion of the insulating protective resin layer 4 with an encapsulant 7.

The improved COF packaging system is favorably employable for packaging an electronic device with a more increased density, because the electronic device can be mounted on a printed wiring board having a very thin wiring layer with no trouble of damage of the wiring copper layer.

However, there arises a new problem in that the heat curable resin composition comprising a polyimide-siloxane, a polyvalent isocyanate, and an organic solvent can be cured only at a high temperature such as approx. 160° C. and, at that temperature, tin of the plated tin layer rapidly diffuses into copper in the wiring copper layer to produce a tin-copper alloy. The tin-copper alloy is not appropriate because the tin-copper alloy formed on the exposed tin layer cannot firmly fix the electronic device via the electroconductive material (typically, gold).

There also is a problem in that the insulating protective resin layer prepared from a heat curable resin composition comprising a polyimide-siloxane, an epoxy resin, and an organic solvent has poor affinity and poor compatibility with the encapsulant.

SUMMARY OF THE INVENTION

Accordingly, it is an object of the present invention to provide a resin composition which is curable at a temperature of 130° C. or lower, to produce an insulating protective resin layer having satisfactory affinity and compatibility with an encapsulant.

The present invention resides in an improvement in a process for packaging an electronic device comprising the steps of:

preparing a printed wiring board which has wiring copper layers coated with a metal layer comprising a metal (e.g., tin) other than copper;

coating the metal layer with an insulating protective resin layer, keeping an area for mounting an electronic device exposed;

mounting the electronic device on the exposed area via an electroconductive material; and coating the mounted electronic device and a portion of the insulating protective resin layer with an encapsulant (including an underfill material);

in which the insulating protective resin layer is produced by employing at least one of the following curable resin compositions (1) to (3):

(1) a resin composition comprising 100 weight parts of an organic solvent-soluble resin having a polysiloxane skeleton and a polar group, 0.5 to 30 weight parts of an epoxy compound having an epoxy equivalent of more than 800, and an organic solvent;

(2) a resin composition comprising 100 weight parts of an organic solvent-soluble resin having a polysiloxane skeleton and a polar group, 0.1 to 10 weight parts of an epoxy compound having an epoxy equivalent of 100 to 800, 2 to 30 weight parts of a polyvalent isocyanate compound, and an organic solvent; and (3) a resin composition comprising 100 weight parts of an organic solvent-soluble resin having a polysiloxane skeleton and a polar group, 0.1 to 20 weight parts of an epoxy compound having an epoxy equivalent of more than 800, 2 to 30 weight parts of a polyvalent isocyanate compound, and an organic solvent.

The invention further resides in a curable resin composition comprising a combination of 100 weight parts of an organic solvent-soluble resin having a polysiloxane skeleton and a polar group, 0.1 to 10 weight parts of an epoxy compound having an epoxy equivalent of 100 to 800, 2 to 30 weight parts of a polyvalent isocyanate compound, and an organic solvent, or a combination of 100 weight parts of an organic solvent-soluble resin having a polysiloxane skeleton and a polar group, 0.1 to 20 weight parts of an epoxy compound having an epoxy equivalent of more than 800, 2 to 30 weight parts of a polyvalent isocyanate compound, and an organic solvent.

The invention furthermore resides in a cured resin material which is produced by curing at least one of the following curable resin compositions (1) to (3):

(1) a resin composition comprising 100 weight parts of an organic solvent-soluble resin having a polysiloxane skeleton and a polar group, 0.5 to 30 weight parts of an epoxy compound having an epoxy equivalent of more than 800, and an organic solvent;

(2) a resin composition comprising 100 weight parts of an organic solvent-soluble resin having a polysiloxane skeleton and a polar group, 0.1 to 10 weight parts of an epoxy compound having an epoxy equivalent of 100 to 800, 2 to 30 weight parts of a polyvalent isocyanate compound, and an organic solvent; and (3) a resin composition comprising 100 weight parts of an organic solvent-soluble resin having a polysiloxane skeleton and a polar group, 0.1 to 20 weight parts of an epoxy compound having an epoxy equivalent of more than 800, 2 to 30 weight parts of a polyvalent isocyanate compound, and an organic solvent, and which shows no glass transition temperature of higher than 160° C.

In the invention, the organic solvent-soluble resin preferably is an organic solvent-soluble polyimide-siloxane. The organic solvent-soluble polyimide siloxane is preferably produced by a reaction of a tetracarboxylic acid compound with a diamine compound and comprises 30 to 95 mol. % of a diaminopolysiloxane compound, 0.5 to 40 mol. % of an aromatic diamine compound having a polar group on an aromatic ring thereof and 0 to 69.5 mol. % of an diamine compound other than the aromatic diamine compound.

The curable resin composition preferably contains a curing catalyst and a filler.

The curable resin composition preferably is curable at a temperature of lower than 130° C.

DETAILED DESCRIPTION OF THE INVENTION

Figure 1:
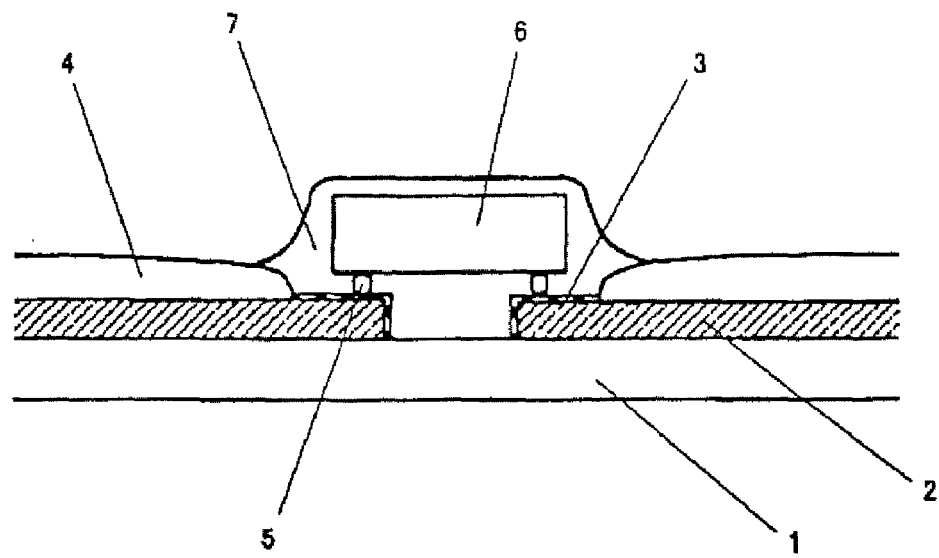
FIG. 1 illustrates a conventional chip on film (COF) packaging.

The present invention provides a curable resin composition that is favorably employable for packaging an electronic device according to COF system. The resin composition is one of the following resin compositions (1) to (3):

(1) a resin composition comprising 100 weight parts of an organic solvent-soluble resin having a polysiloxane skeleton and a polar group, 0.5 to 30 weight parts, preferably 0.5 to 20 weight parts, of an epoxy compound having an epoxy equivalent of more than 800, and an organic solvent;

(2) a resin composition comprising 100 weight parts of an organic solvent-soluble resin having a polysiloxane skeleton and a polar group, 0.1 to 10 weight parts, preferably 0.1 to 7 weight parts, of an epoxy compound having an epoxy equivalent of 100 to 800, 2 to 30 weight parts of a polyvalent isocyanate compound, and an organic solvent; and (3) a resin composition comprising 100 weight parts of an organic solvent-soluble resin having a polysiloxane skeleton and a polar group, 0.1 to 20 weight parts, preferably 0.5 to 15 weight parts, of an epoxy compound having an epoxy equivalent of more than 800, 2 to 30 weight parts of a polyvalent isocyanate compound, and an organic solvent.

[Organic Solvent-Soluble Resin Having a Polysiloxane Skeleton and a Polar Group]

The organic solvent-soluble resin has a polysiloxane skeleton and a polar group. The polar group is capable of reacting with an epoxy group of the epoxy compound and/or an isocyanate group of the polyvalent isocyanate compound. The organic solvent-soluble resin preferably has in its skeleton a rigid segment such as a benzene ring or an imide ring and a cohesive segment such as an amide bonding or a urethane bonding in addition to the flexible polysiloxane skeleton. Preferred is a polyimide-siloxane compound.

The polyimide-siloxane is preferably produced by a reaction of a tetracarboxylic acid compound with a diamine compound in approximately equimolar amounts. The diamine compound preferably comprises 30 to 95 mol. % (preferably 50 to 95 mol. %, more preferably 60 to 95 mol. %) of a diaminopolysiloxane compound, 0.5 to 40 mol. % of an aromatic diamine compound having a polar group on an aromatic ring thereof, and 0 to 69.5 mol. % of a diamine compound other than the aromatic diamine compound having a polar group on an aromatic ring thereof.

Examples of the tetracarboxylic acid compounds include aromatic tetracarboxylic acids such as 2,3,3',4'-biphenyltetracarboxylic acid, 3,3',4,4'-biphenyltetracarboxylic acid, 3,3',4,4'-diphenylethertetracarboxylic acid, 3,3',4,4'-diphenylsulfonetetracarboxylic acid, 3,3',4,4'-benzophenonetetracarboxylic acid, 2,2-bis(3,4-benzenedicarboxylic acid) hexafluoropropane, pyromellitic acid, 1,4-bis(3,4-benzenedicarboxylic acid)benzene, 2,2-bis[4-(3,4-phenoxydicarboxylic acid)phenyl]propane, 2,3,6,7-naphthalenetetracarboxylic acid, 1,2,5,6-naphthalenetetracarboxylic acid, 1,2,4,5-naphthalenetetracarboxylic acid, 1,4,5,8-naphthalenetetracarboxylic acid, and 1,1-bis(2,3-dicarboxyphenyl)ethane; alicyclic tetracarboxylic acids such as cyclopentanetetracarboxylic acid, 1,2,4,5-cyclohexanetetracarboxylic acid, and 3-methyl-4-cyclohexene-1,2,4,5-tetracarboxylic acid; and their dianhydrides and esters.

The diaminopolysiloxane compound preferably has the following formula (1):

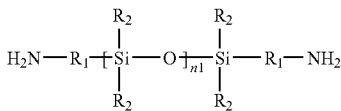

Formula (1)

in which two $R_1$ independently represents a divalent hydrocarbyl group or a divalent aromatic group, four $R_2$ independently represents a monovalent hydrocarbyl group or a monovalent aromatic group, n1 represents an integer of 3 to 50.

Examples of the diaminopolysiloxane compounds of the formula (1) include α,ω-bis(2-aminoethyl)polydimethylsiloxane, α,ω-bis(3-aminopropyl)polydimethylsiloxane, α,ω-bis(4-aminophenyl)polydimethylsiloxane, α,ω-bis(4-amino-3-methylphenyl)polydimethylsiloxane, α,ω-bis(3-aminopropyl)polydiphenylsiloxane, and α,ω-bis(4-aminobutyl)polydimethylsiloxane.

The aromatic diamine compound having a polar group on an aromatic ring thereof preferably has the following formula (2):

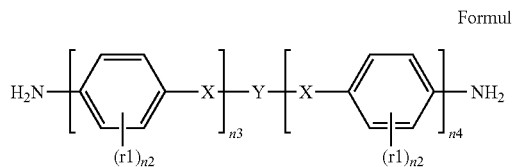

Formula (2)

in which X and Y independently represents a single bond, $CH_2$, $C(CH_3)_2$, $C(CF_3)_2$, O, a benzene ring, or $SO_2$; r1 is COOH or OH; n2 is 1 or 2; and n3 and n4 independently is 0, 1 or 2, under such condition as n3+n4≠0.

Representative examples of the aromatic diamine compounds of the formula (2) are aromatic diamine compounds having an OH group on an aromatic ring thereof or aromatic diamine compounds having a COOH group on an aromatic ring thereof.

Examples of the aromatic diamine compounds having an OH group on an aromatic ring thereof include diaminophenol compounds such as 2,4-diaminophenol; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, and 4,4'-diamino-2,2',5,5'-tetrahydroxybiphenyl; hydroxydiphenylalkane compounds such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis(3-amino-4-hydroxyphenyl)propane, 2,2-bis(4-amino-3-hydroxyphenyl)propane, 2,2-bis(3-amino-4-hydroxyphenyl)hexafluoropropane, and 4,4'-diamino-2,2',5,5'-tetrahydroxydiphenylmethane; hydroxydiphenyl ether compounds such as 3,3'-diamino-4,4'-dihydroxydiphenyl ether, 4,4'-diamino-3,3'-dihydroxydiphenyl ether, 4,4'-diamino-2,3'-dihydroxydiphenyl ether, and 4,4'-diamino-2,2',5,5'-tetrahydroxydiphenyl ether; hydroxydiphenylsulfone compounds such as 3,3'-diamino-4,4'-dihydroxydiphenylsulfone, 4,4'-diamino-3,3'-dihydroxydiphenylsulfone, 4,4'-diamino-2,2'-dihydroxydiphenylsulfone, and 4,4'-diamino-2,2',5,5'-tetrahydroxydiphenylsulfone; bis(hydroxypheno-xyphenyl)alkane compounds such as 2,2-bis[4-(4-amino-3-hydroxyphenoxy)phenyl]propane; bis(hydroxyphenoxy)biphenyl compounds such as 4,4-bis(4-amino-3-hydroxyphenoxy)biphenyl; and bis(hydroxyphenoxyphenyl)sulfone compounds such as 2,2-bis[4-(4-amino-3-hydroxyphenoxy)phenyl]sulfone.

Examples of the aromatic diamine compounds having a COOH group on an aromatic ring thereof include benzene carboxylic acid compounds such as 3,5-diaminobenzoic acid and 2,4-diaminobenzoic acid; carboxybiphenyl compounds such as 3,3'-diamino-4,4'-dicarboxybiphenyl, 4,4'-diamino-3,3'-dicarboxybiphenyl, 4,4'-diamino-2,2'-dicarboxybiphenyl, and 4,4'-diamino-2,2',5,5'-tetracarboxybiphenyl; carboxydiphenylalkane compounds such as 3,3'-diamino-4,4'-dicarboxydiphenylmethane, 4,4'-diamino-3,3'-dicarboxydiphenylmethane, 4,4'-diamino-2,2'-dicarboxydiphenylmethane, 2,2-bis(3-amino-4-carboxyphenyl)propane, 2,2-bis(4-amino-3-carboxyphenyl)propane, 2,2-bis(3-amino-4-carboxyphenyl)hexafluoropropane, and 4,4'-diamino-2,2',5,5'-tetracarboxybiphenyl; carboxydiphenyl ether compounds such as 3,3'-diamino-4,4'-dicarboxydiphenyl ether, 4,4'-diamino-3,3'-dicarboxydiphenyl ether, 4,4'-diamino-2,2'-dicarboxydiphenyl ether, and 4,4'-diamino-2,2',5,5'-tetracarboxydiphenyl ether; carboxydiphenylsulfone compounds such as 3,3'-diamino-4,4'-dicarboxydiphenylsulfone, 4,4'-diamino-3,3'-dicarboxydiphenylsulfone, and 4,4'-diamino-2,2',5,5'-tetracarboxydiphenylsulfone; bis(carboxyphenoxyphenyl)alkane compounds such as 2,2-bis[4-(4-amino-3-carboxyphenoxy)phenyl]propane; bis(carboxyphenoxy)biphenyl compounds such as 4,4'-bis(4-amino-3-carboxyphenoxy)biphenyl; and bis(carboxyphenoxyphenyl)sulfone compounds such as 2,2-bis[4-(4-amino-3-carboxyphenoxy)phenyl]sulfone.

The diamine compound other than the aromatic diamine compound having a polar group on an aromatic ring thereof preferably is an aromatic diamine compound having the following formula (3):

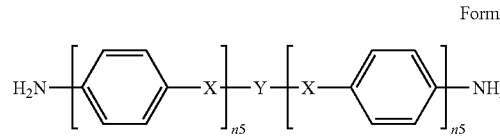

Formula (3)

in which X and Y independently represents a single bond, $CH_2$, $C(CH_3)_2$, $C(CF_3)_2$; O, a benzene ring, or $SO_2$; and n5 is 1 or 2.

Examples of the aromatic diamine compounds of the formula (3) include diamine compounds having one benzene ring such as 1,4-diaminobenzene, 1,3-diaminobenzene, 2,4-diaminotoluene, and 1,4-diamino-2,5-dihalogenobenzene; diamine compounds having two benzene rings such as bis(4-aminophenyl)ether, bis(3-aminophenyl)ether, bis(4-aminophenyl)sulfone, bis(3-aminophenyl)sulfone, bis(4-aminophenyl)methane, bis(3-aminophenyl)methane, bis(4-aminophenyl)sulfide, bis(3-aminophenyl)sulfide, 2,2-bis(4-aminophenyl)propane, 2,2-bis(3-aminophenyl)propane, 2,2-bis(4-aminophenyl)hexafluoropropane, o-dianisidine, o-tolidine, and tolidinesulfonic acid; diamine compounds having three benzene rings such as 1,4-bis(4-aminophenoxy)benzene, 1,4-bis(3-aminophenoxy)benzene, 1,4-bis(4-aminophenyl)benzene, 1,4-bis(3-aminophenyl)benzene, α,α'-bis(4-aminophenyl)-1,4-diisopropylbenzene, and α,α'-bis(4-aminophenyl)-1,3-diisopropylbenzene; and diamine compounds having four or more benzene rings such as 2,2- bis-[4-(4-aminophenoxy)phenyl]propane, 2,2-bis[4-(4-aminophenoxy)phenyl]hexafluoropropane, 2,2-bis[4-(4-aminophenoxy)phenyl]sulfone, 4,4'-(4,4-aminophenoxy)biphenyl, 9,9-bis(4-aminophenyl)fluorene, and 5,10-bis(4-aminophenyl)anthracene.

An aliphatic amine compounds such as hexamethylenediamine or diaminododecane can be employed in combination with the above-mentioned aromatic diamine compounds.

The polyimide-siloxane compound can be prepared from the above-mentioned compounds by known methods such as those described in the aforementioned U.S. Pat. No. 5,252,703.

The polyimide-siloxane preferably has a high molecular weight and has a high imidation ratio. Accordingly, the polyimide-siloxane preferably has a logarithmic viscosity (0.5 g/100 mL of N-methyl-2-pyrrolidone, at 30° C.) of 0.15 or more, more preferably 0.16 to 2. The imidation ratio preferably is 90% or higher, more preferably 95% or more, most preferably essentially 100%.

The polyimide-siloxane compound preferably is in the form of a solution in an organic solvent having a solution viscosity (measured by E-type rotary viscometer) of 1 to 10,000 poises, more preferably 1 to 100 poises.

[Epoxy Compound]

The epoxy compound preferably has an epoxy equivalent in the range of 100 to 4,000, more preferably 100 to 3,000. The epoxy compounds preferably are bisphenol A-type epoxy resins, bisphenol F-type epoxy resins, bifunctional epoxy resins, tri-functional epoxy resins, and epoxy-modified polysiloxanes.

Examples of the epoxy compounds commercially available include a series of compounds available under tradename of Epikote (Japan Epoxy Resin Co., Ltd.), a series of compounds available under tradename of EPICLON (Dai-nippon Ink & Chemical Industry Co., Ltd.), MT0163 (Ciba Geigy Corp.), a series of compounds available under tradename of DENACOL or TENALEX (Nagase Chemtech Co., Ltd.), Hycar ETBN1300×40 (Ube Industries, Ltd.), and KF105 (Shin-etsu Chemical Industries Co., Ltd.).

In the curable resin compositions, an epoxy compound having a epoxy equivalent of 100 to 800 is employed in combination with the organic solvent-soluble resin having a polysiloxane skeleton and a polar group and a polyvalent isocyanate compound, while an epoxy compound having a epoxy equivalent of more than 800 can be employed in combination with the organic solvent-soluble resin having a polysiloxane skeleton alone or with a polyvalent isocyanate compound.

In the former case, 100 weight parts of an organic solvent-soluble resin having a polysiloxane skeleton and a polar group is used in combination with 0.1 to 10 weight parts, preferably 0.5 to 7 weight parts, more preferably 0.5 to 5 weight parts, of an epoxy compound having an epoxy equivalent of 100 to 800, 2 to 30 weight parts, preferably 5 to 20 weight parts, of a polyvalent isocyanate compound, and an organic solvent.

In the latter case, 100 weight parts of the organic solvent-soluble resin having a polysiloxane skeleton and a polar group is used in combination with 0.5 to 30 weight parts, preferably 1 to 20 weight parts, more preferably 2 to 15 weight parts, of an epoxy compound having an epoxy equivalent of more than 800, and an organic solvent. Otherwise, 100 weight parts of an organic solvent-soluble resin having a polysiloxane skeleton and a polar group is used in combination with 0.1 to 20 weight parts, preferably 0.5 to 15 weight parts, more preferably 0.5 to 10 weight parts, of an epoxy compound having an epoxy equivalent of more than 800, 2 to 30 weight parts, preferably 5 to 20 weight parts, of a polyvalent isocyanate compound, and an organic solvent.

The epoxy compound having an epoxy equivalent of more than 800 is preferably used in combination with the organic solvent-soluble resin having a polysiloxane skeleton and a polar group under such condition that a molar ratio of the polar group against the epoxy group of the epoxy compound is in the range of 1/1 to 13/1, specifically 2/1 to 12/1.

[Polyvalent Isocyanate Compound]

The polyvalent isocyanate compound has two or more isocyanate groups in a molecule. Aliphatic, alicyclic or aromatic diisocyanate can be employed. Examples of the diisocyanate compounds include 1,4-tetramethylene diisocyanate, 1,5-pentamethylene diisocyanate, 1,6-hexamethylene diisocyanate, 2,2,4-trimethyl-1,6-hexamethylene diisocyanate, lysine diisocyanate, 3-isocyanatemethyl-3,5,5-trimethylcyclohexyl isocyanate [=isophorone diisocyanate], 1,3-bis(isocyanatemethyl)cyclohexane, 4,4'-dicyclohexylmethane diisocyanate, tolylene diisocyanate, 4,4'-diphenylmethane diisocyanate, 1,5-naphthalene diisocyanate, tolidine diisocyanate, and xylylene diisocyanate.

Derivatives of the aliphatic, alicyclic and aromatic polyvalent isocyanate compounds such as isocyanulate-modified polyvalent isocyanate, biulet-modified polyvalent isocyanate, and urethane-modified polyvalent isocyanate can be employed. The polyvalent isocyanate compounds can be blocked by a blocking agent.

Other details of the polyvalent isocyanate compounds employable in the invention are described in the aforementioned U.S. Pat. No. 6,461,738.

[Organic Solvent]

Examples of the organic solvents employable in the invention can be nitrogen atom-containing solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, and N-methylcaprolactam; sulfur atom-containing solvents such as dimethyl sulfoxide, diethyl sulfoxide, dimethylsulfone, diethylsulfone, and hexamethylsulforamide; phenol solvents such as cresol, phenol, and xylenol; diglyme solvents such as diethylene glycol dimethyl ether (diglyme), triethylene glycol dimethyl ether (triglyme), and tetraglyme; acetone; acetophenone; propiophenone; ethylene glycol; dioxane; tetrahydrofuran; and γ-butylolactone. Preferred are N-methyl-2-pyrrolidone, N,N-dimethyl sulfoxide, N,N-dimethylformamide, N,N-diethylformamide, N,N-dimethylacetamide, N,N-diethylacetamide, γ-butylolactone, triethylene glycol dimethyl ether, and diethylene glycol dimethyl ether.

There are no specific limitations with respect to the amount of the organic solvent in the curable resin composition. However, the organic solvent can be employed preferably in an amount of 60 to 200 weight parts, based on 100 weight parts of the siloxane skeleton-containing resin.

The organic solvent can be incorporated into the curable resin composition in the form of a solution of the polysiloxane skeleton-containing resin in an organic solvent.

[Optionally Incorporatable Compounds]

The curable resin composition preferably contains a dissociation catalyst and/or a curing catalyst. The dissociation catalyst serves to dissociate the blocking agent from the blocked polyisocyanate. The curing catalyst serves to accelerate the crosslinking reaction between the polysiloxane skeleton-containing resin and the epoxy compound (and further the polyvalent isocyanate compound). The dissociation catalyst can be dibutyltin laurate or a tertiary amine. The curing catalyst can be an imidazole compound (e.g., 2-ethyl-4-methylimidazole), hydrazine, or a tertiary amine. The tertiary amine is preferably incorporated. Examples of the tertiary amines include 1,8-diazobicyclo[5,4,0]-7-undecene (DBU), N,N-dimethylbenzylamine (DMBA), and N,N,N',N'-tetramethylhexanediamine. The tertiary diamine can be employed in an amount of 0.3 to 20 weight parts, preferably 0.5 to 10 weight parts, based on 100 weight parts of the polysiloxane skeleton-containing resin.

The curable resin composition of the invention can contain a fine filler such as micro-powdery silica, talc, mica, barium sulfate, or cross-linked NBR powder. The fine filler preferably has a mean size in the range of 0.001 to 15 μm, more preferably 0.005 to 10 μm. The fine filler can be incorporated into the resin composition in an amount of 20 to 150 weight parts, preferably 40 to 125 weight parts, based on 100 weight parts the polysiloxane skeleton-containing resin.

The curable resin composition of the invention can contain a pigment such as a colored organic pigment or a colored inorganic pigment.

The curable resin composition of the invention can contain a anti-foaming agent.

[Utilization of the Curable Resin Composition]

Figure 2:
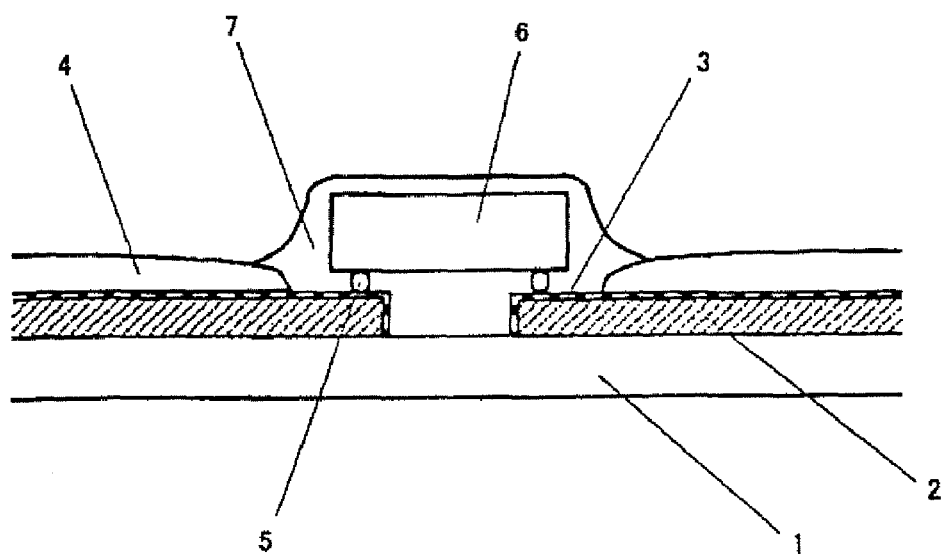
FIG. 2 illustrates an improved chip on film (COF) packaging.

The curable resin composition of the invention can be employed for producing insulating resin coats in various technical fields. The curable resin composition is particularly advantageously employable when the curing temperature should be low such as 130° C. or lower. Accordingly, the curable resin composition of the invention is particularly favorably employable in the aforementioned electronic device packaging process according to the improved COF packaging system (see FIG. 2) which comprises the steps of:

preparing a printed wiring board 1 which has wiring copper layers 2 coated with a metal layer 3 comprising a metal other than copper;

coating the metal layer 3 with an insulating protective resin layer 4, keeping an area for mounting an electronic device exposed;

mounting the electronic device 6 on the exposed area via an electroconductive material 5; and coating the mounted electronic device 6 and a portion of the insulating protective resin layer 4 with an encapsulant 7.

In the step for coating the mounted electronic device and a portion (particularly the edge) of the insulating protective resin layer with an encapsulant, an applied encapsulant is generally heated to approx. 160° C. for curing the encapsulant. At the same time, the already cured insulating protective resin layer is further hardened.

The present invention is further described by the following examples. In the examples, the term "part(s)" means "weight part(s)", unless otherwise indicated.

REFERENCE EXAMPLE 1

Production of Polyimide-Siloxane

In a 500 ml-volume glass flask were heated to 180° C. under stirring 58.84 g (0.2 mol) of 2,3,3',4'-biphenyltetracarboxylic dianhydride and 120 g of triglyme (solvent) under nitrogen gas atmosphere. To the reaction mixture were added 154.7 g (0.17 mol) of α,ω-bis(3-aminopropyl)polydimethylsiloxane (amino equivalent: 455) and 70 g of triglyme, and the resulting mixture was further heated to 180° C. for 60 minutes. To thus obtained reaction mixture were added 8.59 g (0.03 mol) of bis(3-carboxy-4-aminophenyl)methane and 23.4 g of triglyme, and the resulting mixture was further heated to 180° C. for 5 hours. Thus obtained reaction mixture was filtered, to give a polyimide-siloxane solution of $\eta_{inh}$ of 0.18 having a solid content (polymer content) of 50 wt. %.

The imidation ratio is almost 100%. The obtained polyimide-siloxane solution was named polyimide-siloxane solution A.

REFERENCE EXAMPLE 2

Production of Polyimide-Siloxane

In a 500 mL-volume glass flask were heated to 180° C. under stirring 58.84 g (0.2 mol) of 2,3,3',4'-biphenyltetracarboxylic dianhydride and 170 g of triglyme (solvent) under nitrogen gas atmosphere. The reaction mixture were cooled to approx. 100° C., and to this were added 127.4 g (0.14 mol) of α,ω-bis(3-aminopropyl)polydimethylsiloxane (amino equivalent: 455) and 50 g of triglyme, and the resulting mixture was further heated to 180° C. for 60 minutes. Thus obtained reaction mixture was cooled to room temperature, and to this were added 13.52 g (0.03 mol) of 2,2-bis[4-(4-aminophenoxy)phenyl]propane, 4.56 g (0.03 mol) of 3,5-diaminobenzoic acid, and 79 g of triglyme, and the resulting mixture was further heated to 180° C. for 5 hours. Thus obtained reaction mixture was filtered, to give a polyimide-siloxane solution of $\eta_{inh}$ of 0.20 having a solid content (polymer content) of 40 wt. %. The imidation ratio is almost 100%. The obtained polyimide-siloxane solution was named polyimide-siloxane solution B.

EXAMPLE 1

In a glass vessel, the following components were stirred to give a uniform polyimide-siloxane solution composition (solution viscosity: 360 poises):

polyimide-siloxane solution A: 100 parts in terms of solid content;
Epikote 1007 (epoxy equivalent: 2,000): 10 parts;
DBU (tertiary amine): 2 parts;
silicone antifoaming agent: 4 parts;
Aerogil 50 (micropowdery silica): 15.8 parts;
Aerogil 130 (micropowdery silica): 1.8 parts;
barium sulfate: 44 parts;
talc: 11 parts;
mica: 11 parts.

The polyimide-siloxane solution composition showed little viscosity change after keeping at approx. 5° C. for 2 weeks and can be printing by screen-printing procedure.

The polyimide-siloxane solution composition was cured by heating to 120° C., and showed an electric insulation of $5 \times 10^{13}$ Ω·cm (volume resistance).

A polyimide-siloxane solution composition containing no filler components was prepared and cured at 120° C. to give a cured sheet (thickness: 150 μm). The cured composition was cut to give a specimen (5 mm×30 mm×150 μm). The specimen was subjected to determination of Tg by obtaining a variation of loss tangent (tan δ) depending on variation of temperature by means of a viscoelastic analyzer RSA-II (available from Rheometric Scientific Corp.) in tension-compression mode from the temperature of −150° C. at a frequency of 10 Hz under nitrogen stream. The measurements were carried out by increasing the temperature stepwise by 2° C., and keeping the temperature for 30 minutes at each temperature.

Figure 3:
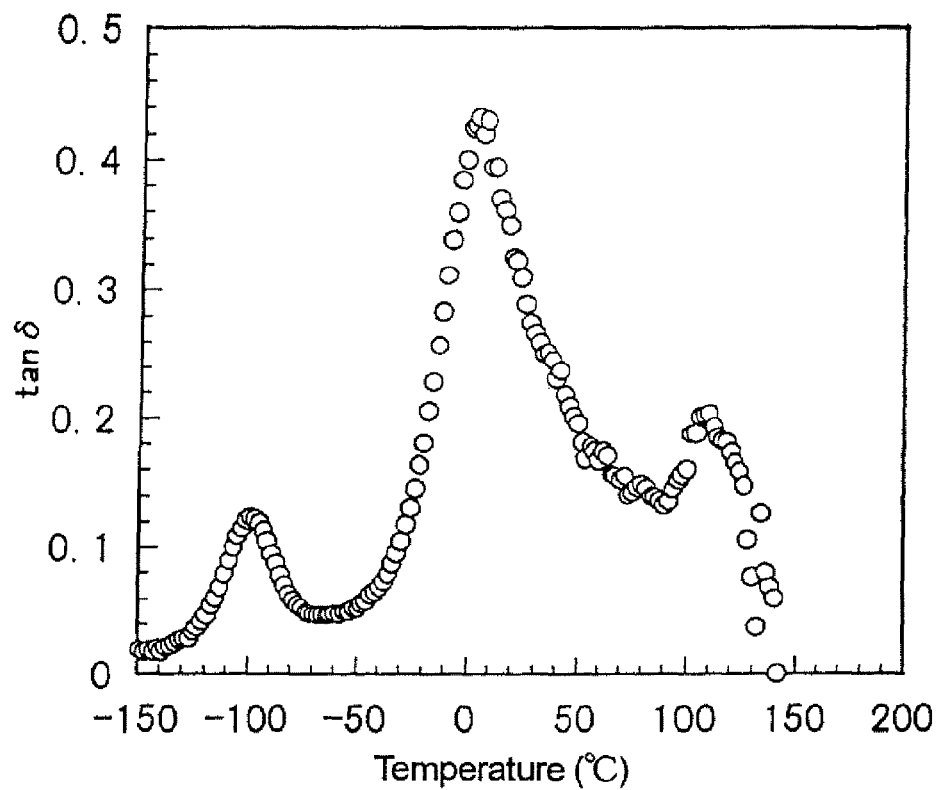
FIG. 3 illustrates glass transition temperatures of a cured resin composition of the invention (Example 1) which are observed on a curve of loss tangent (tan δ) against a temperature increase.

The obtained curve of variation of tan δ is shown in FIG. 3. The highest peak (i.e., the peak observed at the higher temperature side, which indicates Tg) is observed at 110° C.

EXAMPLE 2

A uniform polyimide-siloxane solution composition (solution viscosity: 340 poises) was obtained by the same procedures as those in Example 1 except that Epikote 1007 was replaced with a combination of 5 parts of Epikote 1007 and 5 parts of Epikote 1004 (epoxy equivalent: 900).

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 3. The highest peak (indicating Tg) is observed at 109° C.

EXAMPLE 3

A uniform polyimide-siloxane solution composition (solution viscosity: 300 poises) was obtained by the same procedures as those in Example 1 except that Epikote 1007 was replaced with 10 parts of Epikote 1004 (epoxy equivalent: 900).

The polyimide-siloxane solution composition showed little viscosity change after keeping at approx. 5° C. for 2 weeks and can be printing by screen-printing procedure.

The polyimide-siloxane solution composition was cured by heating to 120° C., and showed an electric insulation of $4 \times 10^{14}$ Ω·cm (volume resistance).

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 3. The highest peak (indicating Tg) is observed at 105° C.

EXAMPLE 4

A uniform polyimide-siloxane solution composition (solution viscosity: 480 poises) was obtained by the same procedures as those in Example 1 except that Epikote 1007 was replaced with 10 parts of Epikote 1004 (epoxy equivalent: 900) and that 0.3 part of 2-ethyl-4-methylimidazole (curing catalyst) was added.

The polyimide-siloxane solution composition showed little viscosity change after keeping at approx. 5° C. for 2 weeks and can be printing by screen-printing procedure.

The polyimide-siloxane solution composition was cured by heating to 120° C., and showed an electric insulation of $1 \times 10^{14}$ Ω·cm (volume resistance).

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 3. The highest peak (indicating Tg) is observed at 116° C.

EXAMPLE 5

A uniform polyimide-siloxane solution composition (solution viscosity: 480 poises) was obtained by the same procedures as those in Example 1 except that Epikote 1007 was replaced with 13.8 parts of Hycar ETBN1300×40 (epoxy equivalent: 2,770, 50% xylene solution).

The polyimide-siloxane solution composition showed little viscosity change after keeping at approx. 5° C. for 2 weeks and can be printing by screen-printing procedure.

The polyimide-siloxane solution composition was cured by heating to 120° C., and showed an electric insulation of $2 \times 10^{13}$ Ω·cm (volume resistance).

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 3. The highest peak (indicating Tg) is observed at 121° C.

EXAMPLE 6

In a glass vessel, the following components were stirred to give a uniform polyimide-siloxane solution composition (solution viscosity: 430 poises):
  polyimide-siloxane solution B (diluted with triglyme to give a solid content of 37%): 100 parts in terms of solid content;
  Epikote 1007 (epoxy equivalent: 2,000): 10 parts;
  DBU (tertiary amine): 2 parts;
  silicone antifoaming agent: 4 parts;
  Aerogil 50 (micropowdery silica): 14 parts;
  barium sulfate: 12 parts;
  talc: 40 parts;
  mica: 10 parts.

The polyimide-siloxane solution composition showed little viscosity change after keeping at approx. 5° C. for 2 weeks and can be printing by screen-printing procedure.

The polyimide-siloxane solution composition was cured by heating to 120° C., and showed an electric insulation of $1 \times 10^{13}$ Ω·cm (volume resistance).

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 3. The highest peak (indicating Tg) is observed at 95° C.

EXAMPLE 7

In a glass vessel, the following components were stirred to give a uniform polyimide-siloxane solution composition (solution viscosity: 300 poises):
  polyimide-siloxane solution A: 100 parts in terms of solid content;
  Epikote 157S70 (epoxy equivalent: 210): 1 part;
  Burnock D-550 (methyl ethyl ketoxime-blocked 1,6-hexamethylene diisocyanate, available from Dai-nippon Ink and Chemical Industries, Co., Ltd.): 10 parts;
  DBU (tertiary amine): 5 parts;
  phthalocyanine green (pigment): 1 part
  silicone antifoaming agent: 2 parts;
  Aerogil 50 (micropowdery silica): 18 parts;
  barium sulfate: 40 parts;
  talc: 20 parts;

The polyimide-siloxane solution composition showed little viscosity change after keeping at approx. 5° C. for 2 weeks and can be printing by screen-printing procedure.

The polyimide-siloxane solution composition was cured by heating to 120° C. The polyimide-siloxane solution composition was heated to 8° C., for 30 min., and to 160° C., for 60 min, and showed an electric insulation of $1.0 \times 10^{15}$ Ω·cm (volume resistance).

A polyimide-siloxane solution composition containing no filler components was prepared and cured in the same manner as in Example 1. A specimen was prepared in the same manner and subjected to the determination of Tg.

Figure 4:
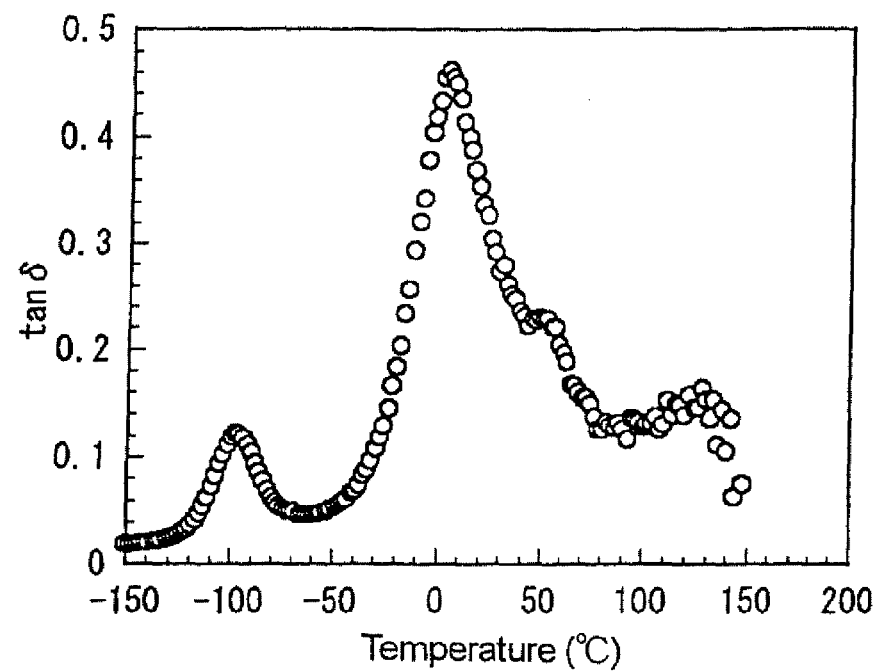
FIG. 4 illustrates glass transition temperatures of a cured resin composition of the invention (Example 7) which are observed on a curve of loss tangent (tan δ) against a temperature increase.

The obtained curve of variation of tan δ is shown in FIG. 4. The highest peak (indicating Tg) is observed at 129° C.

EXAMPLE 8

A uniform polyimide-siloxane solution composition (solution viscosity: 550 poises) was obtained by the same procedures as those in Example 7 except that Burnock D-550 was replaced with 10 parts of burnock D-500 and that DBU was used in an amount of 0.5 part.

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 127° C.

EXAMPLE 9

A uniform polyimide-siloxane solution composition (solution viscosity: 370 poises) was obtained by the same procedures as those in Example 7 except that Barnock D-550 was replaced with 10 parts of Takenate B-842N (methyl ethyl ketoxime-blocked 1,3-bis(isocyanatemethyl)cyclohexane, available from Mitsui-Takeda Chemical Co., Ltd.) and that DBU was used in an amount of 1 part.

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 106° C.

EXAMPLE 10

A uniform polyimide-siloxane solution composition (solution viscosity: 570 poises) was obtained by the same procedures as those in Example 7 except that Epicote 157S70 was replaced with 10 parts of Epikote 1007 (epoxy equivalent: 2,000) and that DBU was used in an amount of 0.5 part.

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 78° C.

EXAMPLE 11

A uniform polyimide-siloxane solution composition (solution viscosity: 330 poises) was obtained by the same procedures as those in Example 7 except that Barnock D-550 was replaced with 10 parts of Takenate B-815N (methyl ethyl ketoxime-blocked 4,4'-dicyclohexylmethane diisocyanate, available from Mitsui-Takeda Chemical Co., Ltd.) and that DBU was used in an amount of 1 part.

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 107° C.

EXAMPLE 12

A uniform polyimide-siloxane solution composition (solution viscosity: 340 poises) was obtained by the same procedures as those in Example 7 except that Epikote 157S70 was replaced with 3 parts of KF105 (epoxy equivalent: 490, available from Sin-etsu Chemical Industries, Co., ltd.) and that DBU was replaced with 7 parts of N,N-dimethylbenzylamine (DMBA).

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 100° C.

EXAMPLE 13

A uniform polyimide-siloxane solution composition (solution viscosity: 300 poises) was obtained by the same procedures as those in Example 7 except that that DBU was used in an amount of 3 parts.

The polyimide-siloxane solution composition showed little viscosity change after keeping at approx. 5° C. for 2 weeks and can be printing by screen-printing procedure.

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 118° C.

EXAMPLE 14

A uniform polyimide-siloxane solution composition (solution viscosity: 480 poises) was obtained by the same procedures as those in Example 7 except that Barnock D500 was used in an amount of 10 parts, that Epikote 157S70 was replaced with 1 part of Epikote 828EL (epoxy equivalent: 190), and that DBU was used in an amount of 0.5 part.

The polyimide-siloxane solution composition showed little viscosity change after keeping at approx. 5° C. for 2 weeks and can be printing by screen-printing procedure.

The polyimide-siloxane solution composition was cured by heating to 120° C. The polyimide-siloxane solution composition was heated to 80° C., for 30 min., and to 160° C., for 60 min, and showed an electric insulation of $2.0 \times 10^{14}$ Ω·cm (volume resistance).

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 90° C.

EXAMPLE 15

A uniform polyimide-siloxane solution composition (solution viscosity: 740 poises) was obtained by the same procedures as those in Example 7 except that Barnock D500 was used in an amount of 10 parts, that Epikote 157S70 was replaced with 10 parts of Epikote 1007 (epoxy equivalent: 2,000), and that DBU was used in an amount of 0.5 part.

The polyimide-siloxane solution composition showed little viscosity change after keeping at approx. 5° C. for 2 weeks and can be printing by screen-printing procedure.

The polyimide-siloxane solution composition was cured by heating to 120° C. The polyimide-siloxane solution composition was heated to 80° C., for 30 min., and to 160° C., for 60 min, and showed an electric insulation of $2.0 \times 10^{14}$ Ω·cm (volume resistance).

A polyimide-siloxane solution composition containing no filler components was prepared and cured in the same manner as in Example 1. A specimen was prepared in the same manner and subjected to the determination of Tg. The obtained curve of variation of tan δ is similar to that of FIG. 4. The highest peak (indicating Tg) is observed at 111° C.

COMPARISON EXAMPLE 1

A uniform polyimide-siloxane solution composition (solution viscosity: 380 poises) was obtained by the same procedures as those in Example 1 except that Epikote 1007 was replaced with 10 parts of Epikote 157S70 (epoxy equivalent: 210) and that DBU was used in an amount of 2 parts.

The polyimide-siloxane solution composition was cured by heating to 120° C.

Figure 5:
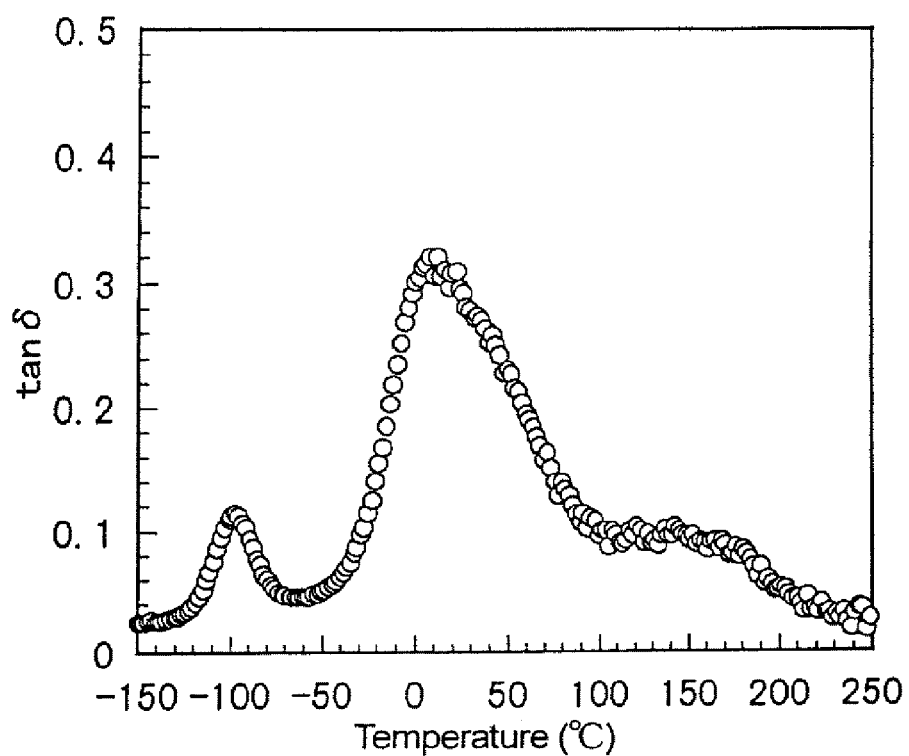
FIG. 5 illustrates glass transition temperatures of a cured known resin composition (Comparison Example 1) which are observed on a curve of loss tangent (tan δ) against a temperature increase.

A polyimide-siloxane solution composition containing no filler components was prepared and cured in the same manner as in Example 1. A specimen was prepared in the same manner and subjected to the determination of Tg. The obtained curve of variation of tan δ is shown in FIG. 5. The highest peak (indicating Tg) is observed at 170° C. This means that the cured protective layer is rigid and hence has no enough flexibility to closely contact with an encapsulant when the encapsulant was heated to 160° C. for curing for final packaging.

COMPARISON EXAMPLE 2

A uniform polyimide-siloxane solution composition (solution viscosity: 270 poises) was obtained by the same procedures as those in Example 7 except that Epikote 157S70 was not used, Barnock D550 was used in an amount of 10 parts, and that DBU was used in an amount of 5 parts.

The polyimide-siloxane solution composition could not cured by heating to 120° C.

COMPARISON EXAMPLE 3

A uniform polyimide-siloxane solution composition (solution viscosity: 380 poises) was obtained by the same procedures as those in Example 7 except that Epikote 157S70 was replaced with 15 parts of Epikote 157S70 (epoxy equivalent: 210) and that DBU was used in an amount of 1 part.

The polyimide-siloxane solution composition was cured by heating to 120° C.

Figure 6:
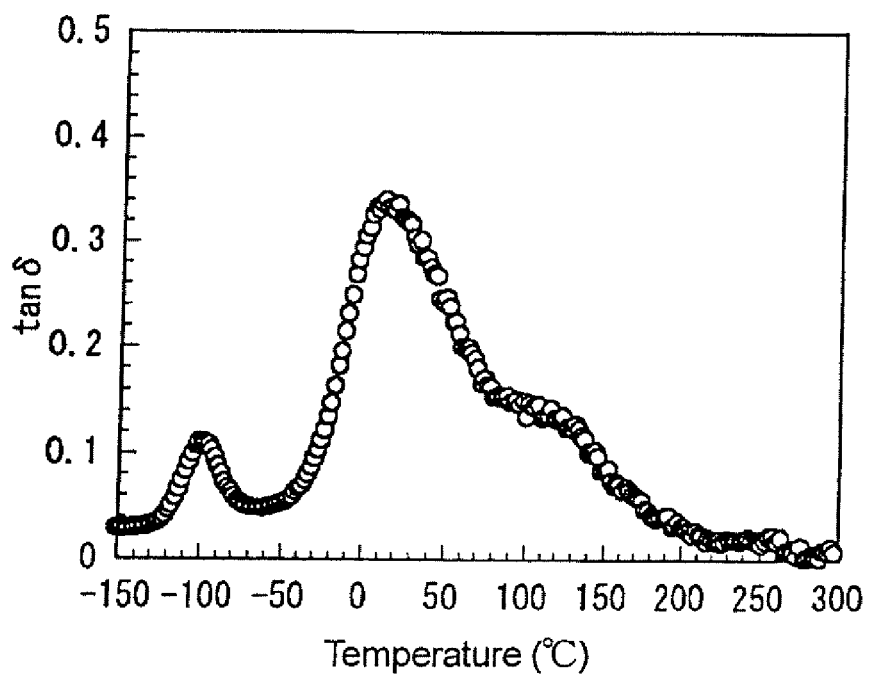
FIG. 6 illustrates glass transition temperatures of a cured known resin composition (Comparison Example 3) which are observed on a curve of loss tangent (tan δ) against a temperature increase.

A polyimide-siloxane solution composition containing no filler components was prepared and cured in the same manner as in Example 1. A specimen was prepared in the same manner and subjected to the determination of Tg. The obtained curve of variation of tan δ is shown in FIG. 6. The highest peak (indicating Tg) is not clear but the peak-forming area is observed in the temperature range of 90 to 220° C. This means that the cured protective layer is rigid and hence has no enough flexibility to closely contact with an encapsulant when the encapsulant was heated to 160° C. for curing for final packaging.

[Evaluation of Cured Resin Composition on Affinity and Fixation to Cured Encapsulant]

Each of the curable resin compositions prepared in Examples 1 to 15 and Comparison Examples 1 to 3 was coated on a luster surface of an electrolytic copper foil (thickness: 35 μm) to give an insulating protective film of 30 μm thick, and heated to give a cured film. On the cured film was dropped a commercially available encapsulant CEL-C-5020 (available from Hitachi Chemical Industry Co., Ltd.) to give a liquid disc film (diameter: approx. 0.5 cm, thickness: approx. 1 mm). The liquid disc film was cured by heating to 160° C. for one hour. Thus obtained specimen was manually bent to observe whether the cured disc film separated from the insulating protective film or not.

The specimens prepared using the curable resin compositions of Examples 1, 2, 5-8, and 10-15, and Comparison Example 2 showed no separation between the cured disc film and the insulating protective film. The specimens prepared using the curable resin compositions of Examples 3, 4, and 9 showed partly separation between the cured disc film and the insulating protective film. The specimens prepared using the curable resin compositions of Comparison Examples 1 and 3 showed apparent separation between the cured disc film and the insulating protective film.

What is claimed is:

1. A process for packaging an electronic device comprising the steps of:
   preparing a printed wiring board which has wiring copper layers coated with a metal layer comprising tin;
   coating the metal layer with an insulating protective resin layer, keeping an area for mounting an electronic device exposed;
   mounting the electronic device on the exposed area via an electroconductive material comprising gold; and
   coating the mounted electronic device and a portion of the insulating protective resin layer with an encapsulant;
   wherein the insulating protective resin layer is produced by employing at least one of the following resin compositions (1) to (3):
   (1) a resin composition comprising 100 weight parts of an organic solvent-soluble resin having a polysiloxane skeleton and a polar group, 0.5 to 30 weight parts of an epoxy compound having an epoxy equivalent of more than 800, and an organic solvent;
   (2) a resin composition comprising 100 weight parts of an organic solvent-soluble resin having a polysiloxane skeleton and a polar group, 0.1 to 10 weight parts of an epoxy compound having an epoxy equivalent of 100 to 800, 2 to 30 weight parts of a polyvalent isocyanate compound, and an organic solvent; and
   (3) a resin composition comprising 100 weight parts of an organic solvent-soluble resin having a polysiloxane skeleton and a polar group, 0.1 to 20 weight parts of an epoxy compound having an epoxy equivalent of more than 800, 2 to 30 weight parts of a polyvalent isocyanate compound, and an organic solvent.

2. The process of claim 1, wherein the organic solvent-soluble resin is an organic solvent-soluble polyimide-siloxane.

3. The process of claim 2, wherein the organic solvent-soluble polyimide siloxane is produced by a reaction of a tetracarboxylic acid compound with a diamine compound comprising 30 to 95 mol. % of a diaminopolysiloxane compound, 0.5 to 40 mol. % of an aromatic diamine compound having a polar group on an aromatic ring thereof and 0 to 69.5 mol. % of an diamine compound other than the aromatic diamine compound.

4. The process of claim 1, wherein the resin composition contains a curing catalyst.

5. The process of claim 1, wherein the resin composition contains a filler.

6. The process of claim 1, wherein the resin composition is curable at a temperature of lower than 130° C.

* * * * *